(12) United States Patent
Kum et al.

(10) Patent No.: US 9,281,491 B2
(45) Date of Patent: Mar. 8, 2016

(54) WHITE ORGANIC LIGHT EMITTING DEVICE

(71) Applicant: LG Display Co., Ltd., Seoul (KR)

(72) Inventors: Tae-Il Kum, Paju-si (KR); Do-Han Kim, Goyang-si (KR); Young-Kwan Jung, Daegu (KR); Ki-Woog Song, Goyang-si (KR); Hye-Seung Kang, Gimpo-si (KR); Hyung-June Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/572,510

(22) Filed: Dec. 16, 2014

(65) Prior Publication Data
US 2015/0188076 A1 Jul. 2, 2015

(30) Foreign Application Priority Data

Dec. 31, 2013 (KR) .......................... 10-2013-0168251

(51) Int. Cl.
*H01L 51/50* (2006.01)
*H01L 51/52* (2006.01)
(Continued)

(52) U.S. Cl.
CPC ........ *H01L 51/5076* (2013.01); *H01L 27/3209* (2013.01); *H01L 51/0067* (2013.01); *H01L 51/0072* (2013.01); *H01L 51/504* (2013.01); *H01L 51/5004* (2013.01); *H01L 51/5016* (2013.01); *H01L 51/5024* (2013.01);
(Continued)

(58) Field of Classification Search
CPC ................... H01L 2251/552; H01L 51/5036; H01L 51/5016; H01L 27/3209; H01L 51/002; H01L 51/5048; H01L 51/5056; H01L 51/506; H01L 51/5076
See application file for complete search history.

(56) References Cited

U.S. PATENT DOCUMENTS

2004/0155238 A1* 8/2004 Thompson .......... H01L 51/0087
257/40
2006/0040132 A1* 2/2006 Liao .................... H01L 51/5036
428/690
(Continued)

FOREIGN PATENT DOCUMENTS

CN 101128936 A 2/2008
EP 2632232 A1 8/2013
(Continued)

OTHER PUBLICATIONS

Li et al., "Tandem organic light-emitting diodes with an effective charge-generation connection structure", Solid State Communications, vol. 150, 2010 (Available online Jun. 20, 2010), pp. 1683-1685.

*Primary Examiner* — Jaehwan Oh
(74) *Attorney, Agent, or Firm* — Birch, Stewart, Kolasch & Birch, LLP

(57) ABSTRACT

A white organic light emitting device including an anode and a cathode opposite to each other, a plurality of stacks disposed between the anode and the cathode, each of the stacks including a hole transport layer, a light emitting layer and an electron transport layer, and an n-type charge generation layer and a p-type charge generation layer disposed between different adjacent stacks, wherein the n-type charge generation layer includes a first organic host, and the p-type charge generation layer includes a second organic host having a LUMO energy level smaller than or equal to a LUMO energy level of the first organic host, and an inorganic dopant containing 1% to 20% by volume of a metal.

16 Claims, 11 Drawing Sheets

(51) Int. Cl.
*H01L 27/32* (2006.01)
*H01L 51/00* (2006.01)

(52) U.S. Cl.
CPC ........ *H01L51/5044* (2013.01); *H01L 51/5278* (2013.01); *H01L 51/006* (2013.01); *H01L 51/0052* (2013.01); *H01L 51/0054* (2013.01); *H01L 51/0058* (2013.01); *H01L 51/0059* (2013.01); *H01L 51/0085* (2013.01); *H01L 2251/552* (2013.01)

(56) References Cited

U.S. PATENT DOCUMENTS

| | | | |
|---|---|---|---|
| 2006/0188745 A1 | 8/2006 | Liao et al. | |
| 2006/0289882 A1 | 12/2006 | Nishimura et al. | |
| 2008/0102310 A1* | 5/2008 | Thompson | H01L 51/5036 428/690 |
| 2010/0288362 A1* | 11/2010 | Hatwar | H01L 51/5044 136/263 |
| 2011/0073844 A1* | 3/2011 | Pieh | H01L 51/5036 257/40 |
| 2011/0079774 A1* | 4/2011 | Kang | C09K 11/06 257/40 |
| 2011/0121320 A1* | 5/2011 | Pieh | H01L 51/5036 257/79 |
| 2012/0075013 A1* | 3/2012 | Leo | H01L 29/866 327/584 |
| 2013/0264551 A1* | 10/2013 | Pieh | H01L 51/5056 257/40 |
| 2014/0203251 A1* | 7/2014 | Jung | H01L 51/0072 257/40 |

FOREIGN PATENT DOCUMENTS

| | | |
|---|---|---|
| JP | 2006-60198 A | 3/2006 |
| JP | 2006-210845 A | 8/2006 |
| JP | 2006-532229 A | 8/2008 |
| JP | 2010-245062 A | 10/2010 |
| JP | 2011-228238 A | 11/2011 |
| JP | 2011-228723 A | 11/2011 |
| KR | 10-2006-0048920 A | 5/2006 |
| KR | 10-2007-0114720 A | 12/2007 |
| TW | 200918839 A | 5/2009 |
| WO | WO 2006/091560 A1 | 8/2006 |
| WO | WO 2009/008352 A1 | 1/2009 |

* cited by examiner

WHITE ORGANIC LIGHT EMITTING DEVICE

CROSS REFERENCE TO RELATED APPLICATIONS

The present application claims the priority benefit of Korean Patent Application No. 10-2013-0168251, filed in the Republic of Korea on Dec. 31, 2013, which is hereby incorporated by reference as if fully set forth herein.

BACKGROUND OF THE INVENTION

1. Field of the Invention

Embodiments of the invention relate to an organic light emitting device and, more particularly, to a white organic light emitting device which secures high efficiency and low voltage by applying co-deposition of an inorganic substance to a charge generation layer provided between adjacent light emitting stacks.

2. Discussion of the Related Art

In recent years, the coming of the information age has brought about rapid development in displays which visually express electrical information signals. In response to this, a great deal of research has been conducted to impart superior properties such as slimness, light weight and low power consumption to a variety of flat display devices.

Specifically, representative examples of flat display devices include liquid crystal display (LCD) devices, plasma display panel (PDP) devices, electroluminescent display (ELD) devices, electrowetting display (EWD) devices, field emission display (FED) devices, organic light emitting diode (OLED) display devices and the like.

Of these, organic light emitting display devices are considered to be competitive in applications which require no additional light sources, implement compact of devices and clearly render color.

Formation of an organic light emitting layer is required for such an organic light emitting display device.

Organic light emitting display devices may exhibit white color by laminating a stack structure including different colors of organic light emitting layers, instead of patterning the organic light emitting layer on a pixel basis.

That is, white organic light emitting display devices are produced by depositing respective layers between an anode and a cathode without using a mask in the formation of light emitting diodes. The white organic light emitting display devices are characterized in that organic films including organic light emitting layers are sequentially formed by depositing different components for the films under vacuum conditions.

The organic light emitting display device may be utilized in a variety of applications including slim light sources, backlights of liquid crystal display devices or full-color display devices using color filters.

Meanwhile, conventional organic light emitting display devices include a plurality of stacks emitting different colors of light wherein each of the stacks includes a hole transport layer, a light emitting layer and an electron transport layer. In addition, each light emitting layer includes a single host and a dopant for rendering color of emitted light, to emit the corresponding color of light based on recombination of electrons and holes injected into the light emitting layer. In addition, a plurality of stacks, each including different colors of light emitting layers, are formed by lamination. In this case, a charge generation layer (CGL) is formed between the stacks so that electrons are received from the adjacent stack or holes are transported thereto. In addition, the charge generation layer is divided into an n-type charge generation layer and a p-type charge generation layer. A charge generation layer structure capable of improving both driving voltage and lifespan is desired.

SUMMARY OF THE INVENTION

Accordingly, the invention is directed to a white organic light emitting that substantially obviates one or more problems due to limitations and disadvantages of the related art.

An object of the invention is to provide a white organic light emitting device which provides high efficiency and low voltage by applying co-deposition of an inorganic substance to a charge generation layer provided between adjacent light emitting stacks.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, white organic light emitting device includes an anode and a cathode opposite to each other, a plurality of stacks disposed between the anode and the cathode, each of the stacks including a hole transport layer, a light emitting layer and an electron transport layer, and an n-type charge generation layer and a p-type charge generation layer disposed between different adjacent stacks, wherein the n-type charge generation layer includes a first organic host, and the p-type charge generation layer includes a second organic host having a lowest unoccupied molecular orbital (LUMO) energy level smaller than or equal to a LUMO energy level of the first organic host, and an inorganic dopant containing 1% to 20% by volume of a metal.

The n-type charge generation layer may include an n-type dopant of an alkali metal or an alkaline earth metal.

The inorganic dopant may have a work function equal to or higher than that of the n-type dopant. In this case, the metal contained in the inorganic dopant may have a work function of 2.9 eV to 5.5 eV.

In addition, the inorganic dopant may include any one of $MgF_2$, $MgCl_2$ and $ZnF_2$.

The inorganic dopant may be doped in the p-type charge generation layer such that the inorganic dopant contacts the n-type charge generation layer. Alternatively, the inorganic dopant may be doped in the p-type charge generation layer such that the inorganic dopant contacts the second stack.

For example, the inorganic dopant can be disposed to a thickness of 0.1 L to L with respect to the total thickness, L, of the p-type charge generation layer.

The inorganic dopant may be disposed in a plurality of portions spaced apart from one another in the p-type charge generation layer.

Meanwhile, the second organic host may have the following chemical formula:

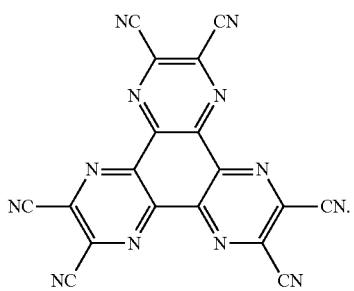 [SMILES: N#Cc1nc2c3nc(C#N)c(C#N)nc3c3nc(C#N)c(C#N)nc3c2nc1C#N]

The stacks between the anode and the cathode may include two stacks, a light emitting layer of a first stack adjacent to the anode may be a blue emitting layer, and a light emitting layer of a second stack may be a phosphorescent emitting layer and may emit yellow green or yellowish green light or reddish green light.

In addition, the phosphorescent emitting layer of the second stack may include a host of at least one hole transport material and a host of at least one electron transport material.

The first organic host may be a compound having an electron transport property in a fused aromatic ring including a heterocyclic ring.

In addition, the n-type dopant may be present in an amount of 0.4% to 3% with respect to the total volume of the n-type charge generation layer.

A triplet level of the hole transport layer and the electron transport layer adjacent to the light emitting layer of each stack may be 0.01 eV to 0.4 eV higher than a triplet level of a host of the light emitting layer.

It is to be understood that both the foregoing general description and the following detailed description of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to embodiments of the invention, examples of which are illustrated in the accompanying drawings. Wherever possible, the same reference numbers will be used throughout the drawings to refer to the same or like parts.

Hereinafter, a white organic light emitting device according to embodiments of the invention will be described in detail with reference to the annexed drawings.

Figure 1:
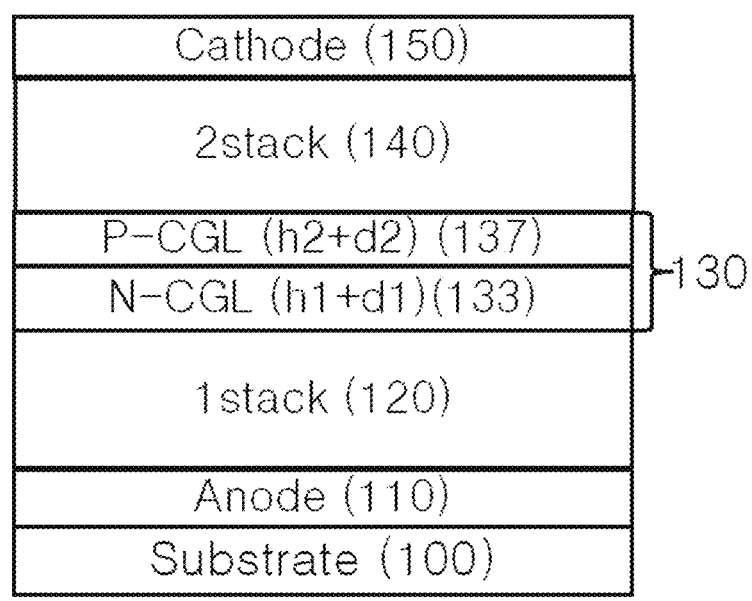
FIG. 1 is a sectional view illustrating a white organic light emitting device according to an embodiment of the invention.

FIG. 1 is a sectional view illustrating a white organic light emitting device according to an embodiment of the invention.

As shown in FIG. 1, a white organic light emitting device according to an embodiment of the invention includes an anode 110 and a cathode 150 opposite to each other on a substrate 100, a plurality of stacks 120 and 140 disposed between the anode 110 and the cathode 150, each of the stacks including a hole transport layer (represented by reference numeral "123" in FIG. 5), a light emitting layer (represented by reference numeral "125" in FIG. 5) and an electron transport layer (represented by reference numeral "127" in FIG. 5), and a charge generation layer 130 disposed between different adjacent stacks 120 and 140, the charge generation layer 130 including an n-type charge generation layer 133 and a p-type charge generation layer 137.

In addition, the n-type charge generation layer 133 includes a first organic host h1 and the p-type charge generation layer 137 includes a second organic host h2 having a LUMO energy level lower than or equal to a LUMO energy level of the first organic host h1 and an inorganic dopant d2 containing 1% to 20% by volume of a metal.

In addition, as shown in FIG. 1, the n-type charge generation layer 133 contains an n-type dopant d1, but the invention is not limited thereto and the n-type charge generation layer 133 may be composed of only the first organic host h1.

Two stacks are shown in FIG. 1, but the invention is not limited thereto and three or more stacks may be applied. In addition, when three or more stacks are provided, the stacks may have a structure in which a plurality of light emitting units including the same color of light emitting layer are repeatedly laminated.

Meanwhile, white light can be emitted toward the cathode 150 or the anode 110 when the respective stacks include a blue stack and a phosphorescent stack emitting light having a longer wavelength than blue light, which are laminated in this order from the bottom.

In addition, FIG. 1 shows that the anode 110 is adjacent to the substrate 100 and the plurality of stacks, and the charge generation layer between the stacks and the cathode 150 are formed thereon. In some cases, the cathode is provided adjacent to the substrate 100, the anode is provided such that the anode faces the cathode, and the charge generation layer is provided between the cathode and the anode in reverse order of the order shown in FIG. 1.

Here, the phosphorescent light emitting layer of the phosphorescent stack includes a host of at least one hole transport material and a host of at least one electron transport material and includes a dopant which emits light having a wavelength of a yellow green or yellowish green region, or a red green region.

In addition, one or two dopants may be contained in the phosphorescent emitting layer of the phosphorescent stack. When two dopants are present, the dopants may be doped at different concentrations.

Meanwhile, in a case in which the first stack 120 is a blue stack, the first stack 120 includes a blue fluorescent emitting layer. In some cases, the blue fluorescent emitting layer may be changed to a blue phosphorescent emitting layer.

In addition, the inorganic dopant d2 contained in the p-type charge generation layer 137 is for example any one of $MgF_2$, $MgCl_2$ and $ZnF_2$. The inorganic dopant d2 is a material that can be thermally deposited together with the second organic host h2 and is an inorganic compound in which a metal having a work function of about 2.9 eV to about 5.5 eV is bonded to an element that can be ionically bonded thereto.

In addition, a work function W2 of the inorganic dopant d2 contained in the p-type charge generation layer 137 is not limited to the value described above and may be equal to or higher than a work function W1 of an n-type dopant d1 composed of an alkali metal or an alkaline earth metal contained in an adjacent n-type charge generation layer 133 and may be smaller than or equal to an absolute value of a LUMO2 value of the second organic host h2 which is a main component of the p-type charge generation layer 137.

If necessary, the n-type charge generation layer 133 does not include an n-type dopant composed of a metal and includes only a first organic host h1 composed of an n-type organic component. In this case, a work function of the metal present in the inorganic dopant d2 contained in the p-type charge generation layer 137 should be higher than an absolute value of a LUMO of the first organic host h1.

Meanwhile, the second organic host h2 of the p-type charge generation layer 137 may be composed of, for example, a quinone compound or HAT-CN represented by the following Formula 1:

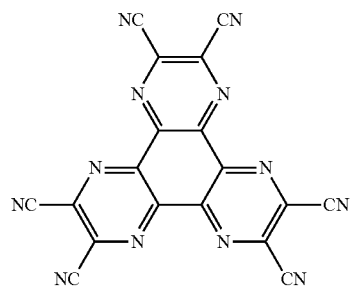 [SMILES: N#Cc1nc2c3nc(C#N)c(C#N)nc3c3nc(C#N)c(C#N)nc3c2nc1C#N]

[Formula 1]

In addition, the inorganic dopant d2 may be doped in the p-type charge generation layer 137 such that it contacts the n-type charge generation layer 133. Alternatively, the inorganic dopant d2 may be doped in the p-type charge generation layer 137 such that it contacts the second stack 140.

In this case, the inorganic dopant d2 may be disposed to a thickness of 0.1 L to L with respect to the total thickness, L, of the p-type charge generation layer 137.

In some cases, the inorganic dopant d2 may be dispersed in a plurality of portions spaced apart from one another in the p-type charge generation layer 137.

Meanwhile, the first organic host h1, which is a major component of the n-type charge generation layer 133, may be a compound having an electron transport property in a fused aromatic ring including a heterocyclic ring.

When the n-type dopant composed of a metal is contained in the n-type charge generation layer 133, the n-type dopant may be present in an amount of 0.4% to 3%, with respect to the total volume of the n-type charge generation layer 133.

In addition, a triplet level of a hole transport layer and an electron transport layer adjacent to the light emitting layer of the each stack 120 or 140 is preferably 0.01 to 0.4 eV higher than a triplet level of a host of the light emitting layer.

In addition, the hole transport layer of the second stack 140 closest to the p-type charge generation layer 137 includes a hole transport material capable of blocking injection of electrons or excitons generated in the adjacent light emitting layer. Alternatively, a single layer of the hole transport layer or an exciton-blocking layer adjacent thereto toward the light emitting layer may be further provided.

Hereinafter, embodiments of the invention will be described in detail with reference to the drawings.

Figure 2A:
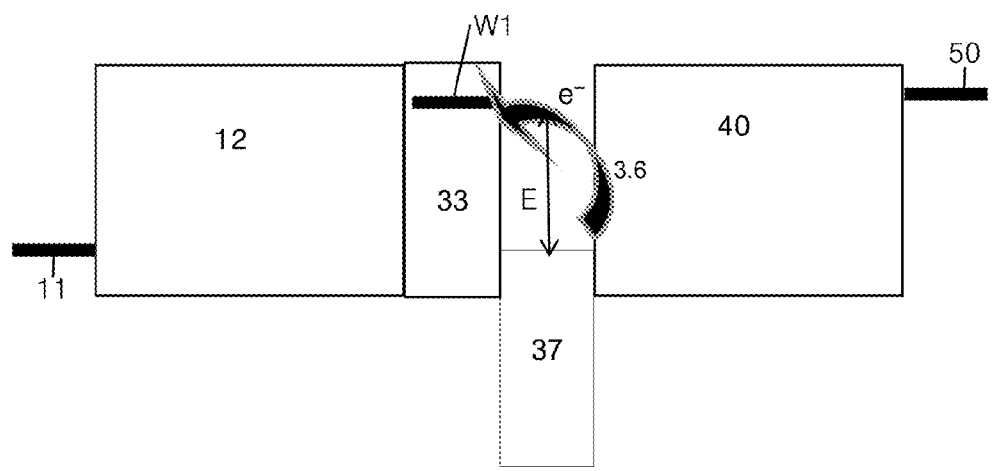
FIGS. 2A and 2B illustrate light emitting stacks and an energy bandgap between charge generation layers disposed between light emitting stacks, regarding white organic light emitting devices of a Reference Example and a first embodiment according to the invention.
Figure 2B:
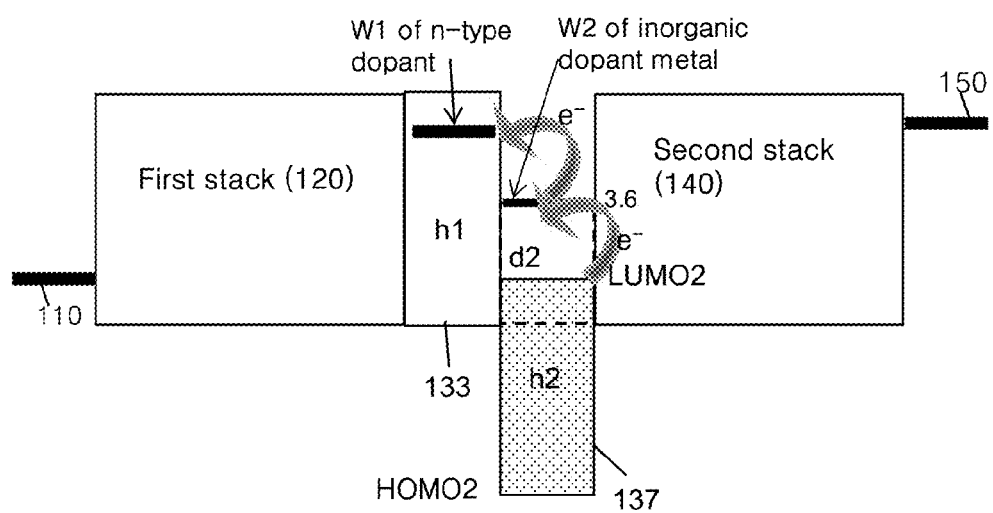

FIGS. 2A and 2B illustrate light emitting stacks and an energy bandgap between charge generation layers disposed between the light emitting stacks, regarding white organic light emitting devices of a Reference Example and a first embodiment according to the invention.

As shown in FIGS. 2A and 2B, the first embodiment according to the invention is different from the Reference Example in that the first embodiment includes the p-type charge generation layer 137 doped with an inorganic dopant d2.

That is, in the Reference Example of FIG. 2A, the p-type charge generation layer 37 is composed of only an organic host, while the first embodiment shown in FIG. 2B incorporates a metal having a work function of about 2.9 eV to about 5.5 eV in an inorganic dopant d2, thereby enabling electrons transported from the second stack 140 to jump from the LUMO energy level of the second organic host h2 of the p-type charge generation layer 137 by a level corresponding to the work function of the inorganic dopant and thus facilitating transfer of electrons to the n-type charge generation layer 133.

In addition, in this case, the work function W2 of the metal contained in the inorganic dopant d2 of the p-type charge generation layer 137 is equal to or higher than the work function W1 and an absolute value thereof is smaller than an absolute value of the LUMO energy level of the second organic host h2, so that an energy barrier E at the interface can be reduced upon transfer of electrons of the p-type charge generation layer 137 to the n-type charge generation layer 133. In this case, the electrons are sequentially jumped and transferred in order of the LUMO energy level of the second organic host of the p-type charge generation layer 137, the work function of the inorganic dopant and the work function of the n-type charge generation layer 133. Accordingly, accumulation of electrons at the interface between the p-type charge generation layer 137 and the n-type charge generation layer 133 is prevented and thus, blocking of holes caused by accumulation of electrons is also prevented. Accordingly, prevention of electron accumulation at the interface between the p-type charge generation layer 137 and the n-type charge generation layer 133 may primarily reduce driving voltage, facilitate transfer of electrons from the n-type charge generation layer 133 to the first stack 120 and transfer of holes from the p-type charge generation layer 137 to the second stack 140 and thus improve the lifespan of such devices.

Here, the reference numerals "110" and "150" not described with reference to FIG. 2B represent an anode and a cathode, respectively.

In addition, the reference numerals "11", "12", "33", "40" and "50" not described with reference to FIG. 2A compared with FIG. 2B represent an anode, a first stack, an n-type charge generation layer, a second stack and a cathode, respectively.

As such, to provide high efficiency, a white organic light emitting device according to an embodiment of the invention utilizes a laminate structure having two or more stacks to improve efficiency. In such a laminate structure, a charge generation layer structure is used for generation and movement of charges. The charges, i.e., holes and electrons are generated at the interface between the p-type charge generation layer and the hole transport layer of the second stack and the generated electrons jump and move to the LUMO energy level of the n-type charge generation layer. As shown in FIG. 2A, when an energy gap E between the p-type charge generation layer and the n-type charge generation layer is large, electrons accumulate at the interface and accumulated electrons interrupt generation of holes. For this reason, voltage is increased and as a result, lifespan is shortened. The increased voltage caused by such a complicated laminate structure is a drawback of white organic light emitting devices, which is an aspect to be solved by the invention.

Accordingly, in order to provide for high efficiency, a white organic light emitting device according to an embodiment of the invention utilizes a laminate structure having two or more stacks to improve efficiency. In such a laminate structure, a charge generation layer (CGL) is used for generation and movement of charges.

Holes and electrons are generated at the interface between the p-type charge generation layer and the hole transport layer of the second stack, and the generated electrons jump and move to the LUMO energy level of the n-type charge generation layer. In order to reduce the energy band gap E between the p-type charge generation layer and the n-type charge generation layer, an inorganic dopant containing 1% to 20% by volume of a metal, in addition to an organic host having a LUMO energy level smaller than or equal to a LUMO energy level of the n-type charge generation layer, is incorporated in the p-type charge generation layer, thereby providing a step of transferring electrons from the p-type charge generation layer to the n-type electron generation layer. As a result, electrons are accumulated at the interface between the n-type charge generation layer and the p-type charge generation layer, and the accumulated electrons prevent blocking of hole generation, thus securing both low-voltage driving and lifespan improvement.

Figure 3:
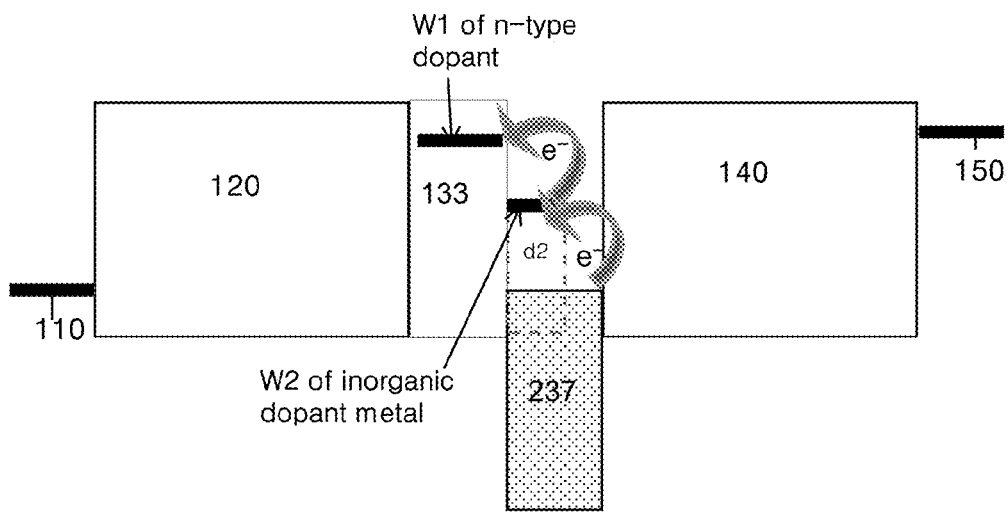
FIG. 3 illustrates light emitting stacks and an energy bandgap between charge generation layers disposed between the light emitting stacks, in a white organic light emitting device according to a second embodiment of the invention.

FIG. 3 illustrates light emitting stacks and an energy bandgap between charge generation layers disposed between the light emitting stacks, in a white organic light emitting device according to a second embodiment of the invention.

As shown in FIG. 3, a white organic light emitting device according to the second embodiment is different from that of the first embodiment in that the inorganic dopant d2 contained in the p-type charge generation layer 237 is formed adjacent to the n-type charge generation layer 133. The remaining structure of the second embodiment is the same as that of the first embodiment and a detailed explanation thereof is thus omitted.

Figure 4:
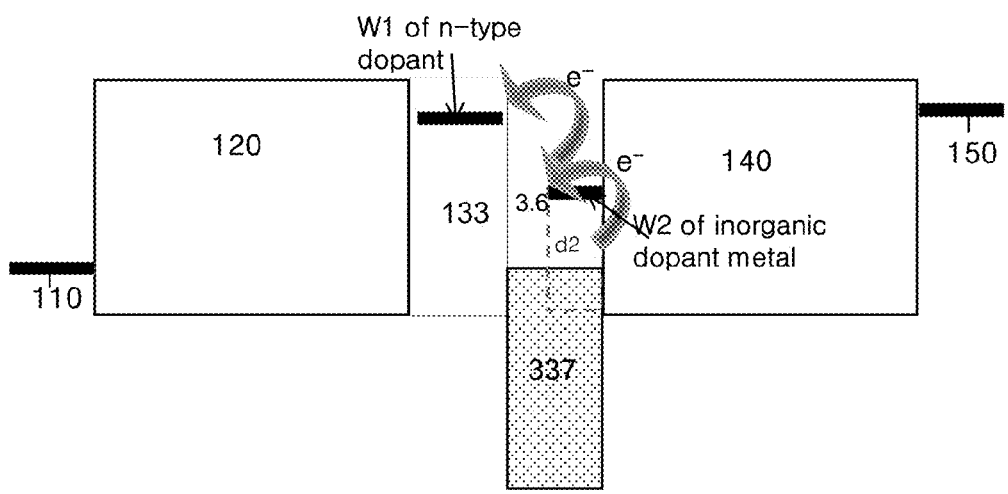
FIG. 4 illustrates light emitting stacks and an energy bandgap between charge generation layers disposed between the light emitting stacks, in a white organic light emitting device according to a third embodiment of the invention.

FIG. 4 illustrates light emitting stacks and an energy bandgap between charge generation layers disposed between the light emitting stacks, in a white organic light emitting device according to a third embodiment of the invention.

As shown in FIG. 4, the white organic light emitting device according to the third embodiment is different from that of the first embodiment in that the inorganic dopant d2 contained in the p-type charge generation layer 337 is formed adjacent to a second stack 140. The remaining structure of the third embodiment is the same as that of the first embodiment and a detailed explanation thereof is thus omitted.

In all of the first to third embodiments, a metal having a work function of about 2.9 eV to about 5.5 eV is incorporated in the inorganic dopant d2. As a result, electrons transferred from the second stack 140 jump from the LUMO energy level of the second organic host h2 in the p-type charge generation layers 137, 237 and 337, by a level corresponding the work function of the inorganic dopant so that the electrons can be easily transferred to the n-type charge generation layer. In addition, in this case, work functions of inorganic dopants 137a, 237a and 337a of the p-type charge generation layers 137, 237 and 337 are equal to or higher than the work function W1 of the n-type dopant d1, and are smaller than an absolute value of a LUMO energy level that of the second organic host h2, thereby reducing an energy barrier at the interface upon transfer of electrons from the p-type charge generation layers 137, 237 and 337 to the n-type charge generation layers 133, 233 and 333.

Figure 5:
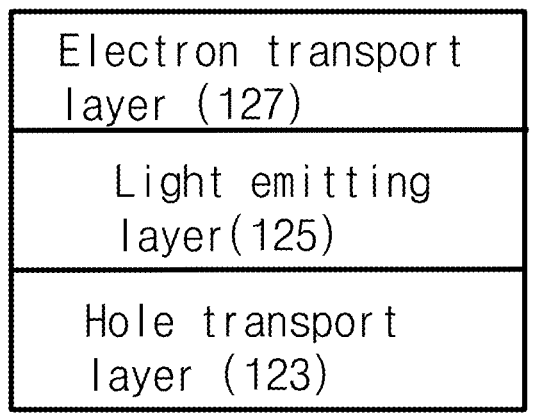
FIG. 5 is a sectional view illustrating a light emitting stack of a white organic light emitting device according to an embodiment of the invention.

FIG. 5 is a sectional view illustrating a light emitting stack of the white organic light emitting device according to an embodiment of the invention.

FIG. 5 illustrates a first stack 120 of a white organic light emitting device according to an embodiment of the invention, wherein the first stack 120 has a basic configuration in which a hole transport layer 123, a light emitting layer 125 and an electron transport layer 127 are laminated in this order.

Each stack of the white organic light emitting device has such a configuration. The first stack 120 adjacent to the anode 110 further includes a hole injection layer disposed under the hole transport layer 123 such that the hole injection layer contacts the anode 110, and the second stack 140 adjacent to the cathode 150 further includes an electron injection layer contacting the cathode 150. In the latter, the electron injection layer is formed on an electron transport layer of the corresponding light emitting stack.

Here, in addition, a triplet level of the hole transport layer 123 and the electron transport layer 127 adjacent to the light emitting layer 125 of each stack 120 is preferably 0.01 eV to 0.4 eV higher than a triplet level of the host of the light emitting layer 125. This functions to prevent excitons generated in each light emitting layer from moving to the hole transport layer or the electron transport layer adjacent to the corresponding light emitting layer.

Hereinafter, effects of the respective embodiments compared to the Reference Example shown in FIG. 2A will be described.

The first stack described below utilizes a blue fluorescent emitting layer as a blue stack, is adjacent to the anode, and includes a hole injection layer, a first hole transport layer, the blue fluorescent emitting layer and a first electron transport layer formed in this order.

In addition, the second stack is adjacent to the p-type charge generation layer 137, 237 or 337 and includes a second hole transport layer, a phosphorescent light emitting layer, a second electron transport layer and an electron injection layer formed in this order. In addition, a case in which the phosphorescent light emitting layer is a yellow green phosphorescent light emitting layer will be described as an example.

In addition, in the first to third embodiments, components of respective layers provided between the anode and the cathode are the same as follows, except that the position of the inorganic dopant in the p-type charge generation layer is changed.

The hole injection layer of the first stack is formed using HAT-CN of Formula 1 and the first hole transport layer is formed using a material represented by the following Formula 2. In addition, the blue fluorescent emitting layer comprises a host represented by the following Formula 3 and a blue dopant represented by the following Formula 4. In addition, the second electron transport layer is then formed using a material represented by Formula 5.

Then, the n-type charge generation layer may be formed using a compound of Formula 5 as a first organic host and a small amount of alkali metal or an alkaline earth metal such as Li or Mg as an n-type dopant.

In addition, the second organic host of the p-type charge generation layer is HAT-CN of Formula 1, the incorporated inorganic dopant can be $MgF_2$ selected from inorganic dopants including $MgF_2$, $MgCl_2$ and $ZnF_2$, and contents thereof are based on the following Tables 1 to 4.

In addition, the second hole transport layer of the second stack can be formed using the material of Formula 2 as described above, and the phosphorescent light emitting layer can include a material of Formula 6 as a host and a material of Formula 7 as a yellow green dopant.

Then, the second electron transport layer can be formed using a material of Formula 5 and the electron injection layer may be formed using LiF.

Meanwhile, materials for respective layers of the first stack, and respective layers, i.e., hole transport layer, light emitting layer and electron transport layer, of the second stack are not limited thereto and may be selected and changed in consideration of hole and electron transport properties. In addition, the dopant of the light emitting layer may be changed according to colors of emitted light required for respective stacks.

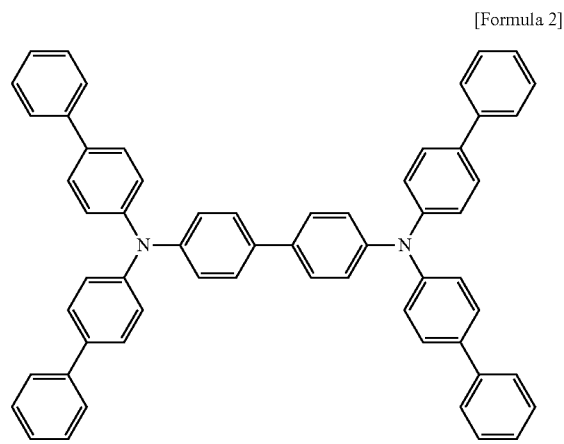

[Formula 2]

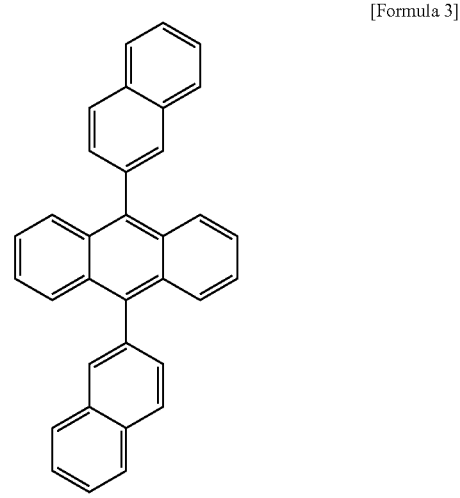

[Formula 3]

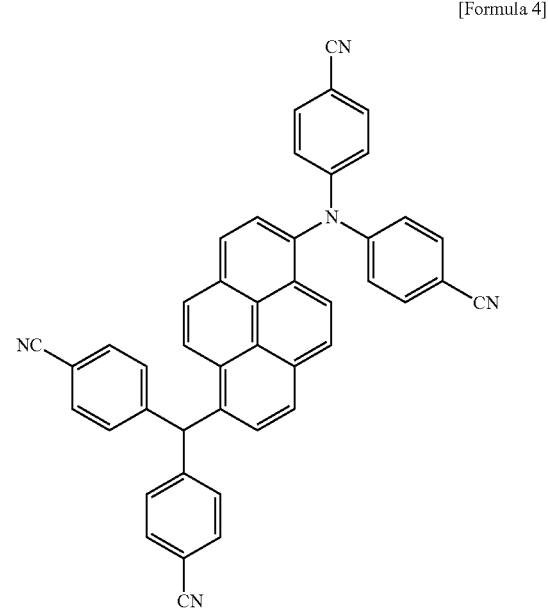

[Formula 4]

-continued

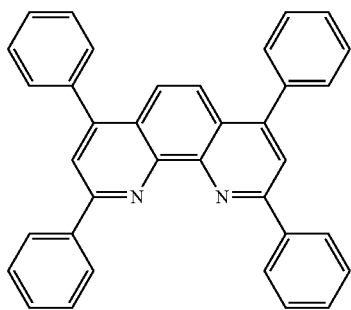

[Formula 5]

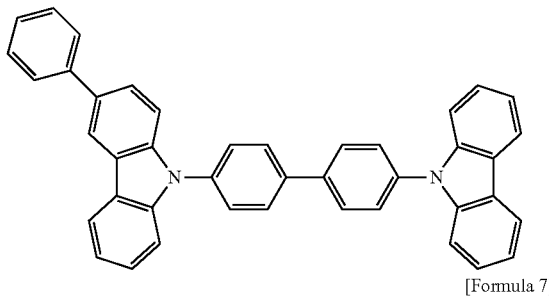

[Formula 6]

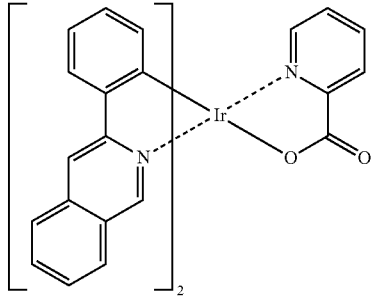

[Formula 7]

Figure 6:
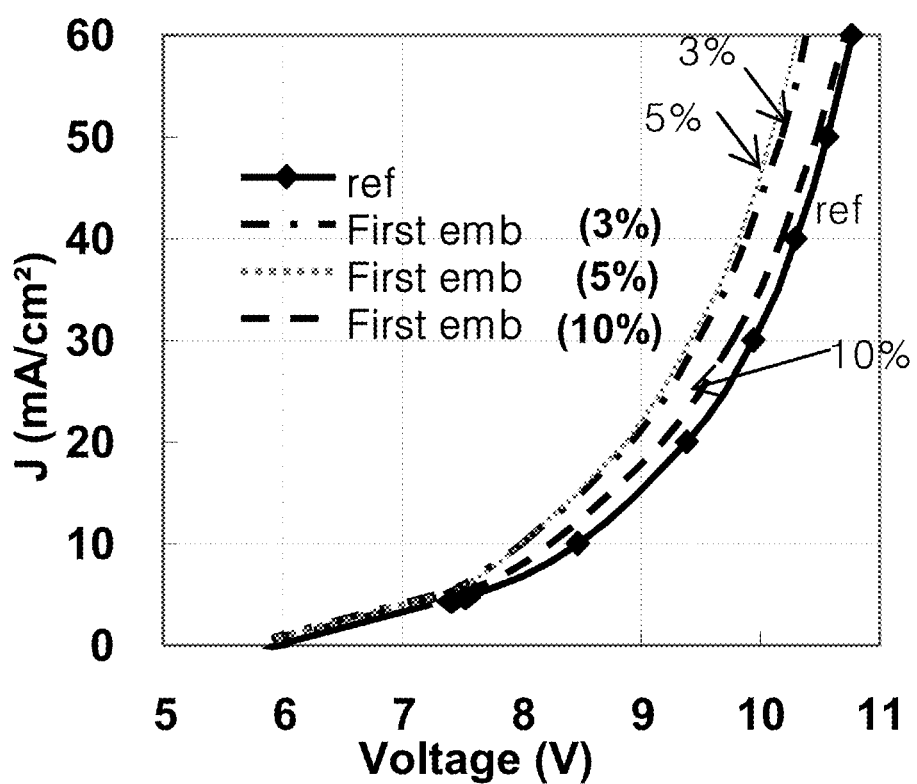
FIG. 6 is a graph showing a relationship between driving voltage and current density at different primary inorganic substance doping doses in a white organic light emitting device according to the first embodiment of the invention.
Figure 7:
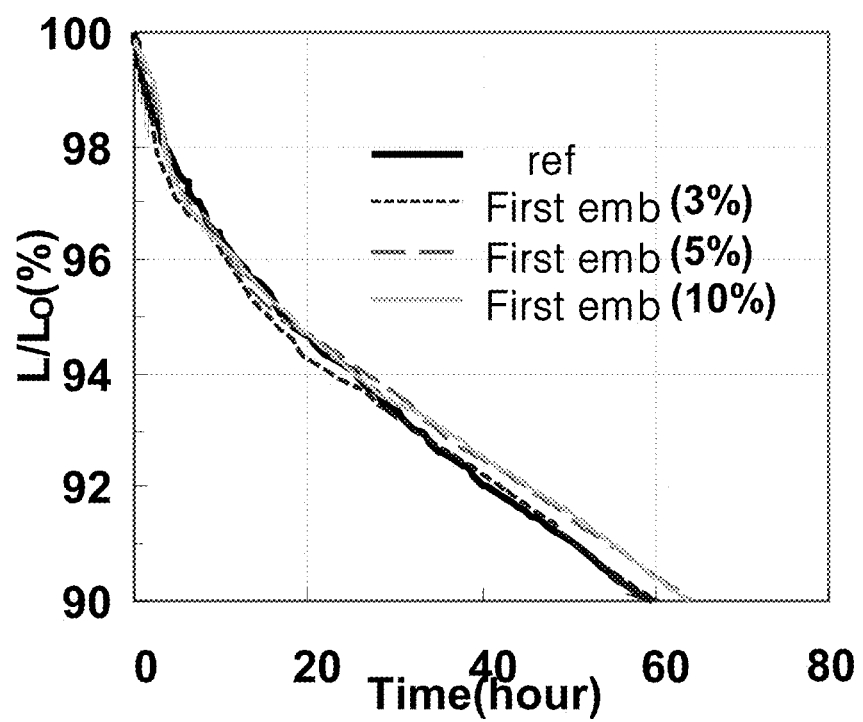
FIG. 7 is a graph showing lifespan according to variation in luminance at different primary inorganic substance doping doses in a white organic light emitting device according to the first embodiment.

FIG. 6 is a graph showing a relationship between driving voltage and current density at different primary inorganic substance doping doses in a white organic light emitting device according to a first embodiment of the invention, and FIG. 7 is a graph showing lifespan according to variations in luminance at different primary inorganic substance doping doses in the white organic light emitting device according to the first embodiment.

TABLE 1

| D5 | | Reference Example | First embodiment (inorganic dopant 3%) | First embodiment (inorganic dopant 5%) | First embodiment (inorganic dopant 10%) |
|---|---|---|---|---|---|
| Structure | P•CGL | HAT-CN | HAT-CN + MgF$_2$ (3%) | HAT-CN + MgF$_2$ (5%) | HAT-CN + MgF$_2$ (10%) |
| Property@ 10 mA/cm$^2$ | Voltage (V) | 100% | 94% | 94% | 96% |
|  | EQE (%) | 100% | 101% | 100% | 100% |
| Property@ 50 mA/cm$^2$ | V | 100% | 96% | 95% | 99% |

As shown in FIGS. 6 and 7 and Table 1, in Reference Examples, only HAT-CN is used as a material for the p-type charge generation layer, while in the first embodiment, HAT-CN is used as the second organic host of the p-type charge generation layer, and MgF$_2$ is used as the inorganic dopant. FIGS. 6 and 7 and Table 1 show driving voltage and lifespan in a Reference Example and in cases of different inorganic dopant (MgF$_2$) contents (3%, 5% and 10%).

Referring to FIG. 6, when the p-type charge generation layer is doped with an inorganic dopant, driving voltage is decreased as compared to the Reference Example at a constant current density. The decrease in driving voltage is about 94% of the Reference Example when inorganic dopant contents are 3% and 5% (at current density of 10 mA/cm$^2$), and driving voltage, when a content of the inorganic dopant is increased to 10%, is about 96% of the Reference Example, which is slightly higher than the case of a small doping dose. At a current density of 50 mA/cm$^2$, driving voltage, when the content of the inorganic dopant is 10%, is 99% of the Reference Example, which indicates that driving voltage is reduced. This case also maintains a condition that the first embodiment has a low driving voltage as compared to the Reference Example.

In addition, as shown in FIG. 7, the Reference Example and first embodiments according to the invention under different content conditions (3%, 5% and 10%) of inorganic dopant, MgF$_2$, exhibits an increase in lifespan with an increase of a doping dose.

In addition, comparing the first embodiments according to the invention under different content inorganic dopant conditions with the Reference Example, external quantum efficiency (EQE) is the same or the first embodiment is superior. The first embodiment exhibits similar or higher external quantum efficiency (EQE), as compared to the Reference Example, such as improved lifespan and increased current density.

Figure 8:
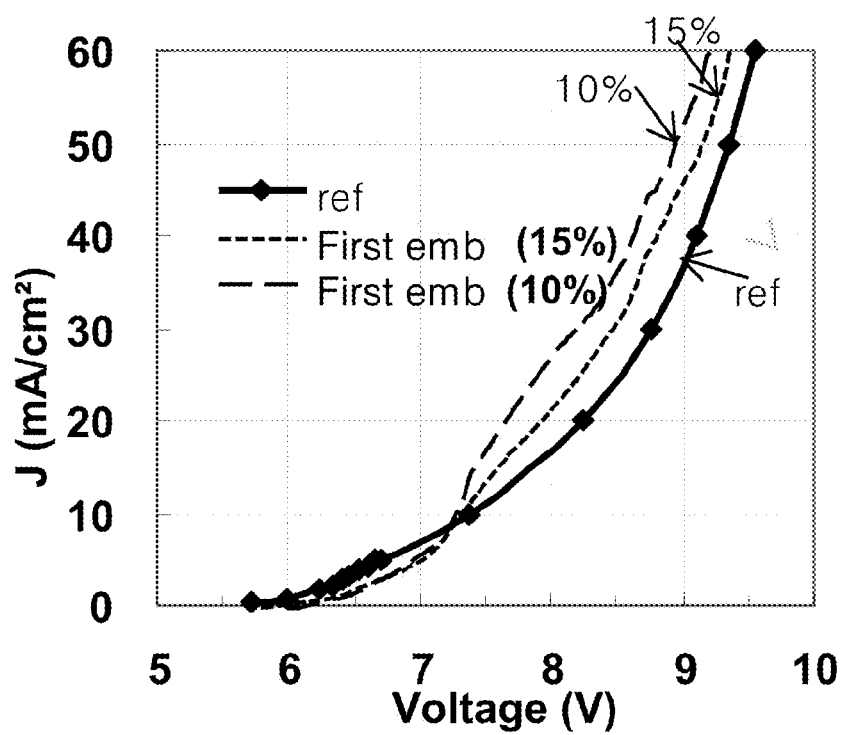
FIG. 8 is a graph showing a relationship between driving voltage and current density at different secondary inorganic substance doping doses in a white organic light emitting device according to the first embodiment of the invention.
Figure 9:
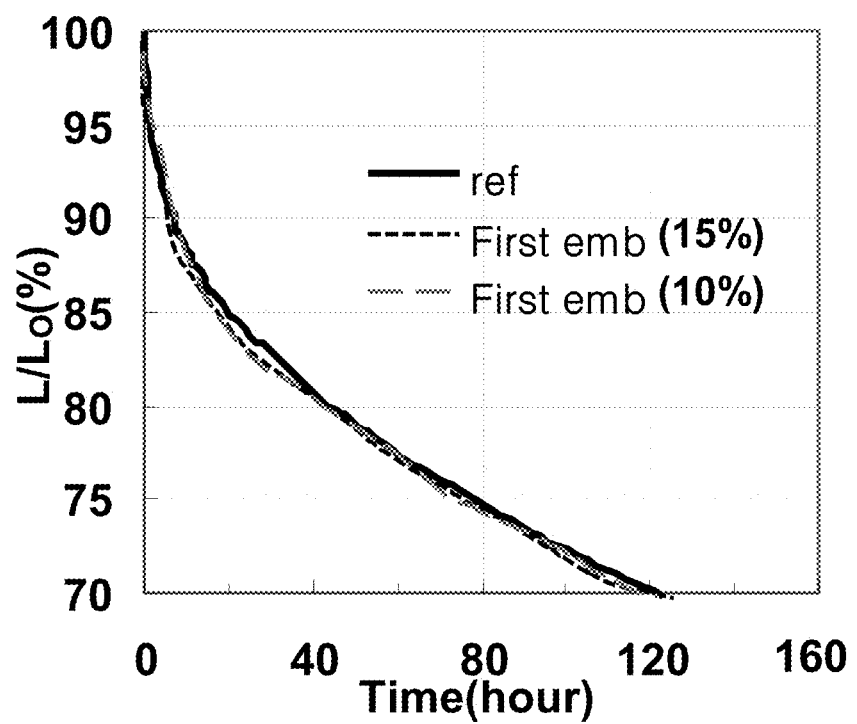
FIG. 9 is a graph showing lifespan according to variation in luminance at different secondary inorganic substance doping doses in a white organic light emitting device according to the first embodiment of the invention.

FIG. 8 is a graph showing a relationship between driving voltage and current density at different secondary inorganic substance doping doses in a white organic light emitting device according to the first embodiment of the invention, and FIG. 9 is a graph showing lifespan according to variations in luminance at different secondary inorganic substance doping doses for a white organic light emitting device according to the first embodiment of the invention.

In this example, the content of inorganic dopant of the first embodiment is increased from 10% to 15%, as compared to Table 1.

TABLE 2

| D5 | | Reference Example | First embodiment (inorganic dopant 15%) | First embodiment (inorganic dopant 10%) |
|---|---|---|---|---|
| Structure | P•CGL | HAT-CN | HAT-CN + MgF$_2$ (15%) | HAT-CN + MgF$_2$ (10%) |
| Property@ 10 mA/cm$^2$ | Voltage (V) | 100% | 101% | 100% |
|  | EQE (%) | 100% | 100% | 100% |
| Property@ 50 mA/cm$^2$ | V | 100% | 98% | 96% |

FIGS. 8 and 9, and Table 2 show driving voltage and lifespan compared to the Reference Example, when contents of the inorganic dopant are 10% and 15%.

In this case, driving voltage is increased by 101% of the Reference Example at a current density of 10 mA/cm$^2$, when the content of inorganic dopant is increased to 15%. In this case too, driving voltage is decreased by 2%, as compared to the Reference Example at an increased current density of 50 mA/cm$^2$. That is, there is an effect of deceasing driving voltage at a high current density although a doping dose is higher than 10%.

FIG. 9 shows similar lifespan behaviors in the Reference Example and cases of the first embodiment wherein the doping dose of an inorganic dopant is 10%, and the first embodiment wherein the doping dose of an inorganic dopant is 15%. This shows results of experiments performed for a long time period, as compared to the lifespan graph shown in FIG. 7, i.e., until a luminance L is decreased to 70% of an initial luminance L0. In the experiment of FIG. 7, the time taken until luminance L is decreased to 90% of the initial luminance L0 is measured. In the Reference Example and the case in which the doping dose of an inorganic dopant is 10%, the graphs of FIGS. 7 and 9 show the same behaviors in the range of the initial luminance L0 from 100% to 90%.

Figure 10:
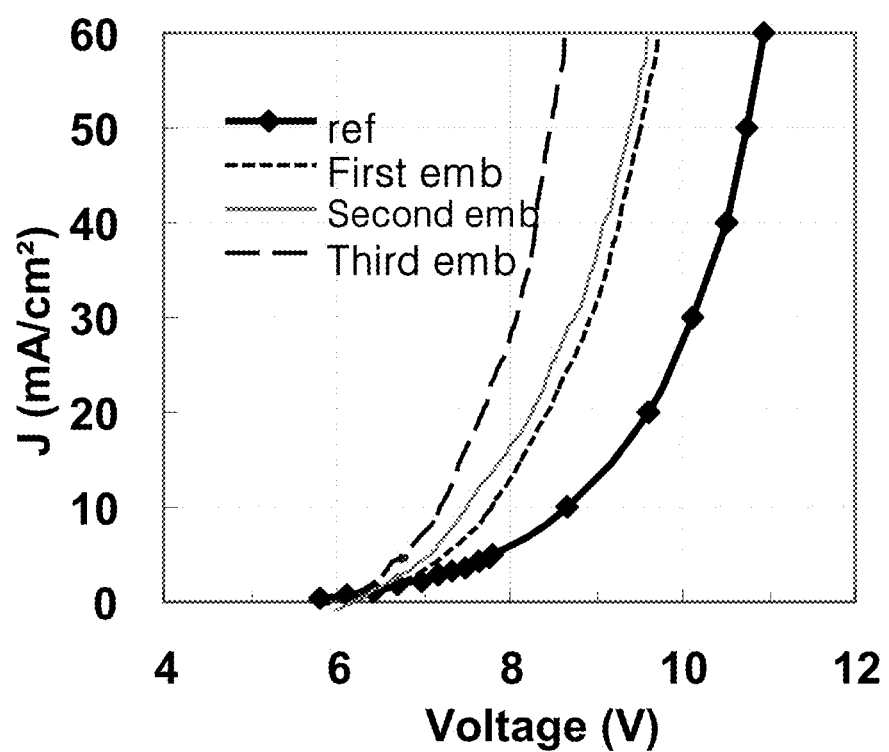
FIG. 10 is a graph showing a relationship between driving voltage and current density at a constant primary inorganic substance doping dose in a white organic light emitting devices according to the first to third embodiments of the invention.
Figure 11:
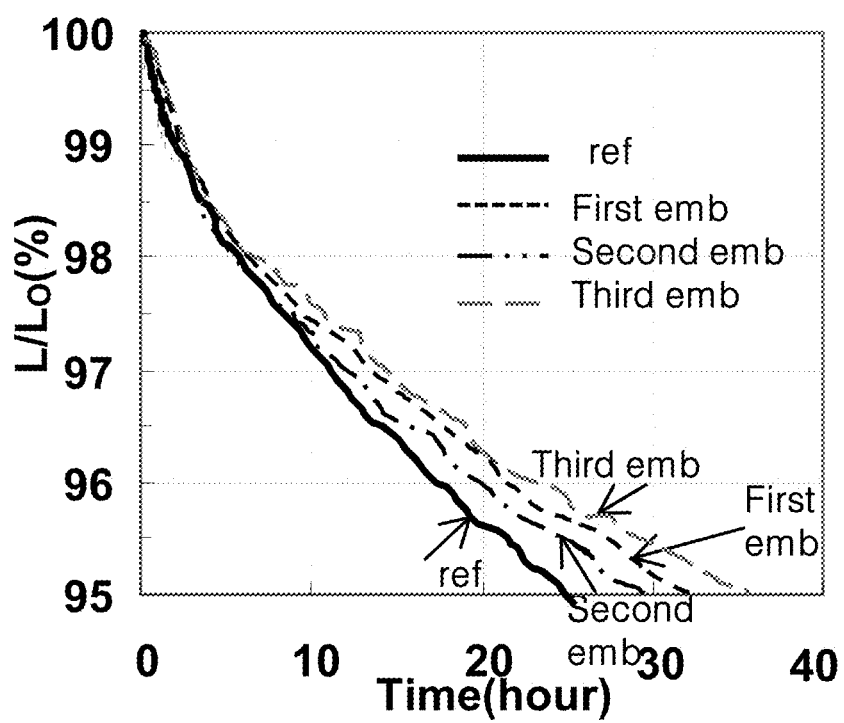
FIG. 11 is a graph showing lifespan according to luminance variation at a constant primary inorganic substance doping dose in a white organic light emitting devices according to the first to third embodiments of the invention.

FIG. 10 is a graph showing a relationship between driving voltage and current density at a constant primary inorganic substance doping dose in white organic light emitting devices according to first to third embodiments of the invention, and FIG. 11 is a graph showing lifespan according to luminance variations at a constant primary inorganic substance doping dose in a white organic light emitting devices according to the first to third embodiments of the invention.

TABLE 3

| D5 | | Reference Example | First embodiment | Second embodiment | Third embodiment |
|---|---|---|---|---|---|
| Structure | P•CGL | HAT-CN (100) | HAT-CN + MgF$_2$ (5%_100 Å) | HAT-CN + MgF$_2$ (5%_50 Å)/ HAT-CN 50 Å | HAT-CN (50 Å)/ HAT-CN + MgF$_2$ (5%_50 Å) |
| Property@ 10 mA/cm$^2$ | Voltage (V) | 100% | 89% | 86% | 83% |
| | EQE (%) | 100% | 100% | 101% | 99% |
| Property@ 50 mA/cm$^2$ | V | 100% | 88% | 87% | 79% |

FIGS. 10 and 11 and Table 3 show driving voltage and lifespan at different current densities of 10 mA/cm2 and 50 mA/cm2 and a constant inorganic dopant content of 5% in the first to third embodiments, specifically, in a case in which the inorganic dopant is dispersed over the entire region of the p-type charge generation layer (first embodiment), in a case in which the inorganic dopant is dispersed adjacent to the n-type charge generation layer (second embodiment) and in a case in which the inorganic dopant is dispersed adjacent to the second stack (third embodiment).

As can be seen from FIG. 10 and Table 3, at a current density of 10 mA/cm$^2$, the driving voltage of the first embodiment is 89% of the Reference Example, the driving voltage of the second embodiment is 86% of the Reference Example, and the driving voltage of the third embodiment is 83% of the Reference Example. This indicates that all of the first to third embodiments exhibit a great decrease in driving voltage as compared to the Reference Example. In this case, external quantum efficiencies (EQE) of the respective embodiments are 100%, 101% and 99% of the Reference Example, respectively. This error range of 1% means that the respective embodiments exhibit substantially equivalent efficiencies.

In addition, at a current density of 50 mA/cm$^2$, the driving voltage of the first embodiment is 88% of the Reference Example, the driving voltage of the second embodiment is 87% of the Reference Example, and the driving voltage of the third embodiment is 79% of the Reference Example. This means that all the embodiments exhibit a great decrease in driving voltage, as compared to the Reference Example.

In this case, as shown in FIG. 11, the Reference Example exhibits a lifespan, i.e., the time taken until luminance L is decreased to 95% of initial luminance L0, of 25 hours, but all of the first to third embodiments exhibit lifespans of 30 or more hours. The embodiments exhibit a 20% or more increase in lifespan (e.g., the time taken until luminance is decreased to at least 95% of initial luminance L0), as compared to the Reference Example. In addition, in the cases in which the initial luminance is 90%, 75% and 50%, rather than about 95%, differences in lifespan between the embodiments and Reference Example are significant (see comparison of FIGS. 7 and 9). In particular, in the third embodiment, lifespan, i.e., the time taken until luminance reaches 95% of initial luminance L0, is about 35 hours and the third embodiment has a lifespan increase of about 40% as compared to the Reference Example.

Figure 12:
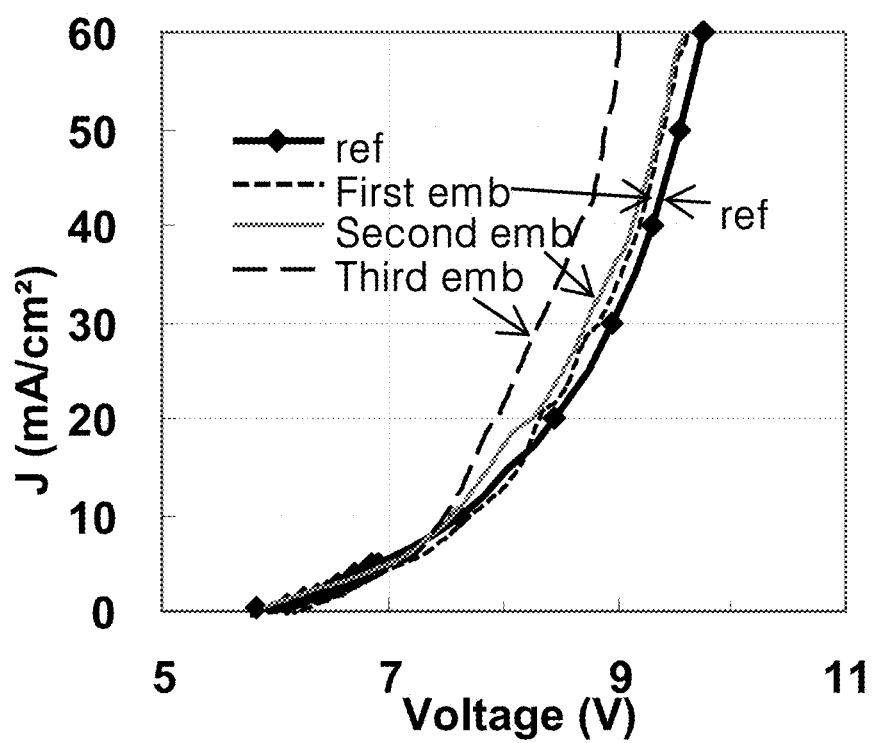
FIG. 12 is a graph showing a relationship between driving voltage and current density at a constant secondary inorganic substance doping dose in white organic light emitting devices according to first to third embodiments of the invention.
Figure 13:
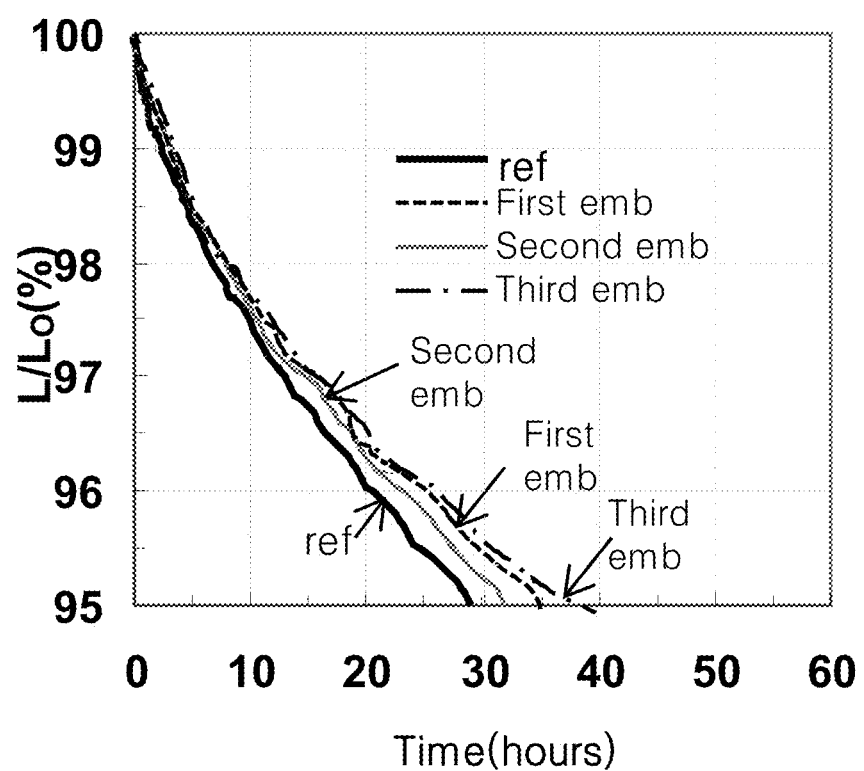
FIG. 13 is a graph showing lifespan according to luminance variation at a constant second inorganic substance doping dose in white organic light emitting devices according to the first to third embodiments of the invention.

FIG. 12 is a graph showing a relationship between driving voltage and current density at a constant secondary inorganic substance doping dose in white organic light emitting devices according to first to third embodiments of the invention, and FIG. 13 is a graph showing lifespan according to luminance variations at a constant second inorganic substance doping dose in white organic light emitting devices according to the first to third embodiments of the invention.

TABLE 4

| D5 | | Reference Example | First embodiment | Second embodiment | Third embodiment |
|---|---|---|---|---|---|
| Structure | P•CGL | HAT-CN (100) | HAT-CN + MgF$_2$ (10%_100) | HAT-CN + MgF$_2$ (10%_50)/ HAT-CN (50) | HAT-CN (50)/ HAT-CN + MgF2 (10%_50) |
| Property@ 10 mA/cm$^2$ | Voltage (V) | 100% | 100% | 100% | 100% |
| | EQE (%) | 100% | 100% | 101% | 99% |
| Property@ 50 mA/cm$^2$ | V | 100% | 98% | 98% | 93% |

FIGS. 12 and 13 and Table 4 show driving voltage and lifespan at current densities of 10 mA/cm$^2$ and 50 mA/cm$^2$ at a constant inorganic dopant content of 5% in the first to third embodiments, specifically, in a case in which the inorganic dopant is dispersed over the entire region of the p-type charge generation layer (first embodiment), in a case in which the inorganic dopant is dispersed adjacent to the n-type charge generation layer (second embodiment) and in a case in which the inorganic dopant is dispersed adjacent to the second stack (third embodiment).

As can be seen from FIG. 12 and Table 4, at a current density of 10 mA/cm$^2$, the driving voltage of the first embodiment is 100% of the Reference Example, the driving voltage of the second embodiment is 100% of the Reference Example, and the driving voltage of the third embodiment is 100% of the Reference Example. This indicates that there is no great difference between the Reference Example and the embodiments at a current density of 10 mA/cm$^2$.

However, at a current density of 50 mA/cm$^2$, the driving voltage of the first embodiment is 98% of the Reference Example, the driving voltage of the second embodiment is 98% of the Reference Example, and the driving voltage of the third embodiment is 93% of the Reference Example. This means that the first to third embodiments exhibit a great decrease in driving voltage as compared to the Reference Example.

In this case, as shown in FIG. 13, the Reference Example exhibits a lifespan, a time taken until luminance L is decreased to 95% of initial luminance L0, of 28 hours, but all of the first to third embodiments exhibit lifespans of 32 or more hours. The embodiments exhibit a 14% or more increase in lifespan (e.g., the time it takes until luminance is decreased to at least 95% of initial luminance L0), as compared to the Reference Example. In addition, in the cases in which the intended luminance is 90%, 75% or 50% of initial luminance, rather than about 95% of initial luminance, it is expected that differences in lifespan between the embodiments and the Reference Example are significant (see comparison of FIGS. 7 and 9). In particular, in the third embodiment, the time until the lifespan reaches 95% of initial luminance L0 is about 40 hours and the third embodiment has about a 40% or more increase in lifespan as compared to the Reference Example.

For example, the n-type dopant, such as Li, used for the n-type charge generation layer has a work function of 2.9 eV and HAT-CN which is a component of an organic substance (e.g., the second organic host) used for the p-type charge generation layer has a LUMO level of −5.5 eV.

In a white organic light emitting device according to an embodiment the invention, the p-type charge generation layer can be doped with an inorganic dopant at 20% or less, to form an intermediate step facilitating transfer of electrons from −5.5 eV. which is a LUMO level of the HAT-CN component of the p-type charge generation layer to 2.9 eV. which is a work function of the n-type dopant of the n-type charge generation layer and thereby prevent blocking of hole generation caused by an accumulation of electrons and thus a decrease in lifespan between two stacks. In addition, a cascade structure to facilitate transfer of electrons to the n-type charge generation layer and enable smooth injection of more electrons thereto is formed. Effects of decreasing voltage and increasing lifespan can be obtained by doping with an organic substance.

Application of tandem device structures is required for high performance white organic light emitting devices, but driving voltage increases as the laminate structure becomes more complex. The invention can impart high efficiency to white organic light emitting devices and provide low driving voltage by applying a cascade structure to a charge generation layer necessarily used for a tandem device structure by using a co-deposition layer composed of an inorganic substance.

The white organic light emitting device according to an embodiment of the invention implements a low voltage device by co-depositing an inorganic substance to the charge generation layer.

The white organic light emitting device according to an embodiment of the invention has the following effects.

The p-type charge generation layer among charge generation layers respectively connecting adjacent light emitting stacks is doped with an inorganic compound containing a metal having a work function equal to or higher than that of the metal contained in the n-type charge generation layer, so that accumulation of electrons is prevented at the interface between the p-type charge generation layer and the n-type charge generation layer, an amount of electrons injected to the n-type charge generation layer is increased and the flow of electrons is thus facilitated. As a result, white organic light emitting devices can be implemented at a low driving voltage.

In addition, the inorganic dopant is incorporated into the p-type charge generation layer, thereby preventing blocking of hole generation caused by electron accumulation at the interface, since the flow of electrons is smooth. Therefore, it is possible to improve hole generation efficiency, facilitate transport of holes to adjacent stacks, and thus improve lifespan.

It will be apparent to those skilled in the art that various modifications and variations can be made in the invention without departing from the spirit or scope of the invention. Thus, it is intended that the invention covers modifications and variations of this invention provided they come within the scope of the appended claims and their equivalents.

What is claimed is:

1. A white organic light emitting device comprising:
an anode and a cathode opposite to each other;
a plurality of stacks disposed between the anode and the cathode, each of the stacks including a hole transport layer, a light emitting layer and an electron transport layer; and
an n-type charge generation layer and a p-type charge generation layer disposed between different adjacent stacks,
wherein the n-type charge generation layer comprises a first organic host, and
the p-type charge generation layer comprises:
a second organic host having a LUMO energy level smaller than or equal to a LUMO energy level of the first organic host; and
an inorganic dopant containing 1% to 20% by volume of a metal.

2. The white organic light emitting device according to claim 1, wherein the n-type charge generation layer comprises an n-type dopant of an alkali metal or an alkaline earth metal.

3. The white organic light emitting device according to claim 2, wherein the dopant of the inorganic dopant has a work function equal to or higher than that of the n-type dopant.

4. The white organic light emitting device according to claim 3, wherein the metal contained in the inorganic dopant has a work function of 2.9 eV to 5.5 eV.

5. The white organic light emitting device according to claim 3, wherein the inorganic dopant comprises any one of $MgF_2$, $MgCl_2$ and $ZnF_2$.

6. The white organic light emitting device according to claim 1, wherein the inorganic dopant is doped in the p-type charge generation layer such that the inorganic dopant contacts the n-type charge generation layer and is spaced apart from the second stack.

7. The white organic light emitting device according to claim 1, wherein the inorganic dopant is doped in the p-type charge generation layer such that the inorganic dopant contacts the second stack and is spaced apart from the n-type charge generation layer.

8. The white organic light emitting device according to claim 1, wherein the inorganic dopant is disposed to a thickness of 0.1 L to L with respect to the total thickness, L, of the p-type charge generation layer.

9. The white organic light emitting device according to claim 1, wherein the inorganic dopant is disposed in a plurality of portions spaced apart from one another in the p-type charge generation layer.

10. The white organic light emitting device according to claim 1, wherein the second organic host has the following chemical formula:

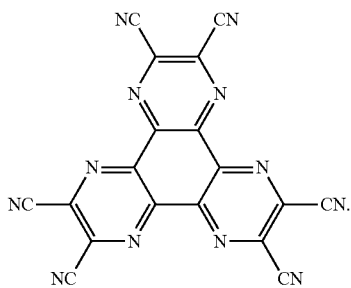

11. The white organic light emitting device according to claim 1, wherein the stacks between the anode and the cathode include two stacks,
a light emitting layer of a first stack adjacent to the anode is a blue emitting layer, and
a light emitting layer of a second stack is a phosphorescent emitting layer and emits yellow green light or yellowish green light, or reddish green light.

12. The organic light emitting device according to claim 11, wherein the phosphorescent emitting layer of the second stack comprises a host of at least one hole transport material and a host of at least one electron transport material.

13. The organic light emitting device according to claim 1, wherein the first organic host is a compound having an electron transport property in a fused aromatic ring including a heterocyclic ring.

14. The organic light emitting device according to claim 2, wherein the n-type dopant is present in an amount of 0.4% to 3% with respect to the total volume of the n-type charge generation layer.

15. The organic light emitting device according to claim 1, wherein a triplet level of the hole transport layer and the electron transport layer adjacent to the light emitting layer of each stack is 0.01 eV to 0.4 eV higher than a triplet level of a host of the light emitting layer.

16. The organic light emitting device according to claim 3, wherein work functions of the metal contained in the inorganic dopant of the p-type charge generation layer and the n-type dopant are smaller than an absolute value of the LUMO energy level of the second organic host.

* * * * *